United States Patent
Tseng

(10) Patent No.: US 6,455,428 B1
(45) Date of Patent: Sep. 24, 2002

(54) METHOD OF FORMING A METAL SILICIDE LAYER

(75) Inventor: Horng-Huei Tseng, Hsin-Chu (TW)

(73) Assignee: Vanguard International Semiconductor Corporation, Hsin-chu (TW)

(*) Notice: Subject to any disclaimer, the term of this patent is extended or adjusted under 35 U.S.C. 154(b) by 71 days.

(21) Appl. No.: 09/696,080

(22) Filed: Oct. 26, 2000

(51) Int. Cl.[7] ................ H01L 21/302; H01L 21/461; H01L 21/44

(52) U.S. Cl. ............... 438/689; 438/691; 438/700; 438/750; 438/664

(58) Field of Search ............... 438/672–685, 438/281–300, 745–750, 753, 359, 689–692, 704

(56) References Cited

U.S. PATENT DOCUMENTS 6,090,707 A * 7/2000 Sharan et al. ............ 438/682
6,140,234 A * 10/2000 Uzoh et al. .............. 438/678
6,300,201 B1 * 10/2001 Shao et al. .............. 438/281

* cited by examiner

Primary Examiner—Caridad Everhart
Assistant Examiner—Calvin Lee
(74) Attorney, Agent, or Firm—George O. Saile; Stephen B. Ackerman

(57) ABSTRACT

A process for forming a metal silicide layer on the surface of a conductive region in a semiconductor substrate, located at the bottom of a contact hole formed in an insulator layer, has been developed. The process features the removal of a photoresist shape, used to define the contact hole, via removal procedures that avoid the formation of a substoichiometric, silicon oxide, native oxide layer, on the top surface of the conductive region. The removal of the contact hole defining photoresist shape is realized via a chemical mechanical polishing procedure, which results in no native oxide formation, or removal of the photoresist shape can be accomplished via a combination of chemical mechanical polishing and wet clean procedure, which will form a native oxide layer, however only comprised of easily removable stoichiometric silicon oxide. The inability to remove substoichiometric silicon oxide, formed from procedures such as plasma oxygen ashing, can deleteriously influence the formation of metal silicide layers on the surface of a conductive region.

10 Claims, 2 Drawing Sheets

METHOD OF FORMING A METAL SILICIDE LAYER

BACKGROUND OF THE INVENTION (1) Field of the Invention

The present invention relates to methods used to fabricate semiconductor devices, and more specifically to a method used to form a metal silicide layer for a semiconductor device.

(2) Description of Prior Art

The use of metal silicide layers, formed on underlying source/drain, and polysilicon gate structures of semiconductor devices, has reduced word line and bit line resistance, thus improving the performance of these semiconductor devices, when compared to counterparts fabricated without metal silicide layers. Metal silicide layers have been formed using a self-align metal silicide (Salicide), process, in which a blanket metal layer is deposited, overlying both source/drain and polysilicon regions, as well as overlying insulator layers. Subsequent anneal procedures result in the formation of the desired metal silicide layer on source/drain, and polysilicon regions, while the metal remains unreacted in regions overlying insulator surfaces. Selective removal of the unreacted metal results in the attainment of metal silicide layers, self-aligned to conductive silicon or polysilicon regions.

For many cases a conductive region, such as a source/drain region of a metal oxide semiconductor field effect transistor (MOSFET), device, is prepared for metal silicide formation, via initially opening a contact hole, in an insulator layer, exposing the source/drain region. The contact hole opening is usually performed via wet or dry etching procedures, using a photoresist shape as an etch mask. Removal of the masking photoresist shape, prior to deposition of the metal layer, can be accomplished via dry or wet procedures. A commonly used, photoresist dry removal procedure is plasma oxygen ashing, resulting in the ashing or volatilization of the organic photoresist shape. This step however is performed with the top surface of the source/drain region exposed in the contact hole, thus resulting in the formation of a thin silicon oxide layer on the top surface of the exposed source/drain region. Removal of the silicon oxide layer is critical in allowing the desired metal silicide layer to be formed on the oxide free source/drain surface. However plasma oxygen ashing can form a silicon oxide layer, comprised of both stoichiometric silicon oxide ($SiO_2$), as well as substoichiometric silicon oxide ($SiO_x$), where X is greater than zero but less than two. The substoichiometric component of the native oxide formed on the top surface of the source/drain region during plasma oxygen ashing is difficult to remove via buffered hydrofluoric acid procedures, performed post plasma oxygen ashing, and thus can interfere with the objective of forming metal silicide layers on the conductive regions exposed in contact holes that have experienced as plasma oxygen ashing, photoresist removal procedure..

This invention will describe a process for forming a metal silicide layers on conductive region exposed in a contact hole, however without the conductive region, exposed in the contact hole, experiencing a photoresist removal procedure which employs an oxygen source which will create a native oxide, comprised of substoichiometric silicon oxide. The absence of an oxygen source, as for example created during a plasma oxygen ashing, photoresist shape removal procedure, allows the surface of a conductive region, located at the bottom of the contact hole, to remain oxide free, and thus remain in a more favorable state for subsequent metal silicide formation. Prior art, such as Sharan et al, in U.S. Pat. No. 6,090,707, describe a process for forming a metal silicide layer on a conductive silicon region, previously subjected to a oxygen containing photoresist removal procedure, which formed a native oxide comprised of both stoichiometric and substoichiometric silicon oxide on the top surface of the conductive layer on which metal silicide is to be formed on. That prior art then has to convert the difficult to remove, substoichiometric silicon oxide layer to a more easily removable stoichiometric silicon oxide, via a ozone treatment. In contrast this present invention removes the masking photoresist shape without the use of an oxygen component, thus avoiding native oxide growth on the surface of the conductive region in the contact hole, and thus avoiding additional process steps needed in prior art for conversion to, and removal of, silicon oxide. In addition this invention will describe a photoresist removal procedure in which a post-photoresist removal, wet cleanup procedure is employed, forming a native oxide, however with the native oxide only comprised with the easily removable stoichiometric silicon oxide component, not the difficult to remove substoichiometric silicon oxide component.

SUMMARY OF THE INVENTION

It is an object of this invention to from a metal silicide layer on the top surface of a conductive region, in a semiconductor substrate, exposed at the bottom of the contact hole opening in an insulator layer.

It is another object of this invention to remove the photoresist shape, used to define the contact hole opening, via a chemical mechanical polishing (CMP), procedure, or via a combination of a CMP procedure, and a sulfuric acid—hydrogen peroxide treatment, to maintain a silicon oxide free top surface, or a substoichiometric silicon oxide free top surface, for the conductive region exposed in the contact hole.

It is still another object of this invention to deposit a metal layer on the top surface of the conductive region, exposed in the contact hole, followed by an anneal cycle forming the desired metal silicide layer.

In accordance with the present invention a method of forming a metal silicide layer, on a conductive region in a semiconductor substrate, exposed at the bottom of a contact hole, is described. After forming a conductive region in a semiconductor substrate, an insulator layer is deposited. A photoresist shape is used as an etch mask to allow a contact hole opening to be created in the insulator layer, exposing a portion of the top surface of the conductive region. A chemical mechanical polishing procedure, or a combination chemical mechanical—wet organic clean procedure, is then employed to remove the photoresist shape without forming a silicon oxide layer comprised with a substoichiometric silicon oxide component, on the top surface of the conductive region exposed in the contact hole. A pre-clean procedure, removing any stoichiometric silicon oxide from the top surface of the exposed conductive region, is followed by deposition of a metal layer. A subsequent anneal procedure results in the formation of the metal silicide layer, on the exposed top surface of the conductive region, followed by the selective removal of unreacted metal, located on non-conductive, or insulator surfaces.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
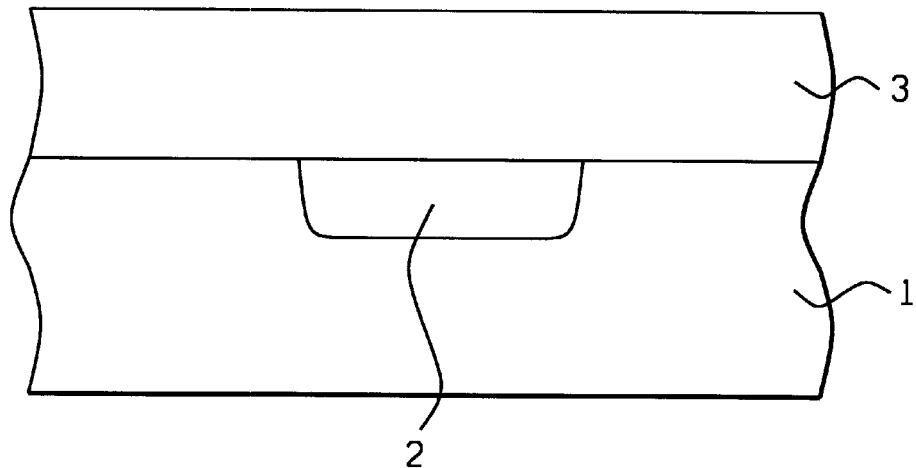
FIGS. 1–4, which schematically, in cross-sectional style, show the key stages used to form a metal silicide layer on the top surface of a conductive region, located at the bottom of a contact hole opening in an insulator layer, featuring the removal of the contact hole defining photoresist shape via procedures that avoid the formation of a native oxide, comprised with a substoichiometric silicon oxide component, on the top surface of the exposed conductive region.

The method of forming a metal silicide layer on the top surface of a conductive region, located at the bottom of a contact hole opening in an insulator layer, and featuring the removal of the contact hole defining photoresist shape via procedures that avoid the formation of a native oxide comprised with a substoichiometric silicon oxide component, formed on the top surface of the exposed conductive region, will now be described in detail.. Semiconductor substrate 1, comprised of P type, single crystalline silicon, with a <100> crystallographic orientation, is used and schematically shown in FIG. 1. Conductive region 2, such as a source/drain region used in a MOSFET device, is formed in semiconductor substrate 1, via conventional photolithographic and ion implantation procedures. Conductive region 2, can be a N type source/drain region, for a N channel MOSFET device, formed in P type, semiconductor substrate 1, via implantation of arsenic or phosphorous ions. Conductive region 2, can also be a P type source/drain region, for a P type MOSFET device, formed in an N well region, in semiconductor substrate 1, via implantation of boron or $BF_2$ ions. The surface concentration of conductive region 2, is between about 1E19 to 1E21 atoms/cm$^3$. After removal of the photoresist shape, used to define conductive region 2, via plasma oxygen ashing and careful wet clean procedures, insulator layer 3, is deposited using low pressure chemical vapor deposition (LPCVD), or plasma enhanced chemical vapor deposition (PECVD), or grown via thermal oxidation procedures. Insulator layer 3, shown schematically in FIG. 3, at a thickness between about 5000 to 12000 Angstroms, can be comprised of silicon oxide or borophosphosilicate glass (BPSG). If desired insulator layer 3, can be a composite insulator layer, comprised with an overlying silicon nitride layer, on an underlying silicon oxide, or BPSG layer. The use of silicon nitride as an overlying layer, can behave as a stop layer to a subsequent chemical mechanical polishing procedure.

Figure 2:
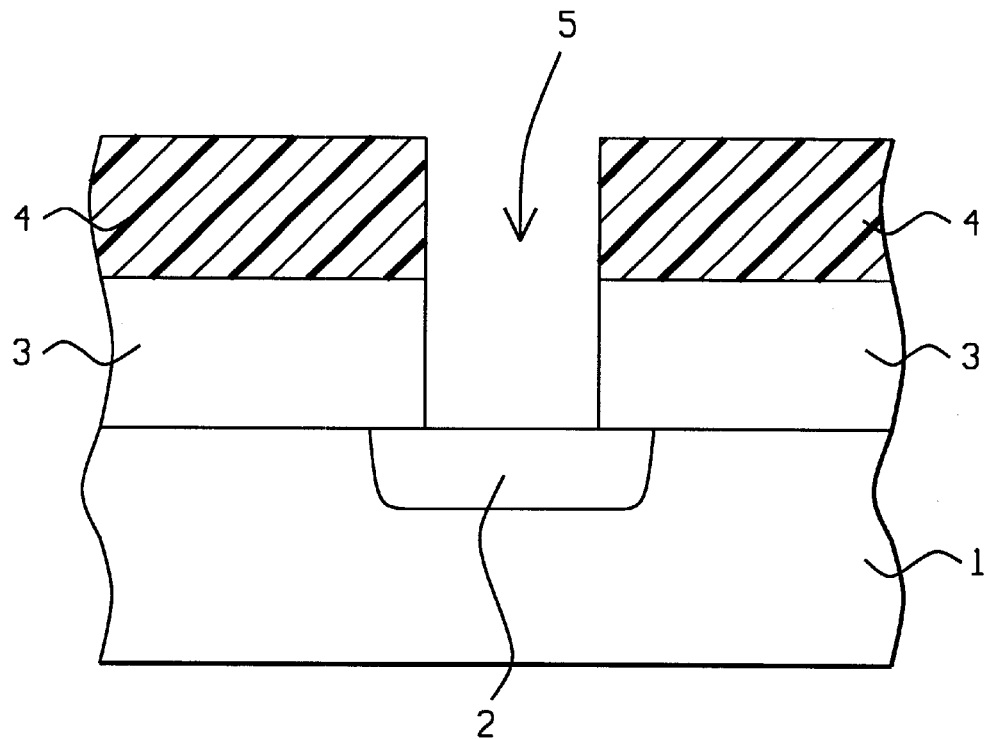

Photoresist shape 4, is next used as an etch mask to allow contact hole opening 5, to be created in insulator layer 3, exposing a top portion of conductive region 2. Contact hole opening 5, with a diameter between about 0.05 to 1.0 um, is formed via an anisotropic, reactive ion etching (RIE), procedure, using $CHF_3$ or $CF_4$ as an etchant for insulator layer 3. The result of this procedure is schematically shown in FIG. 2.

Figure 3:
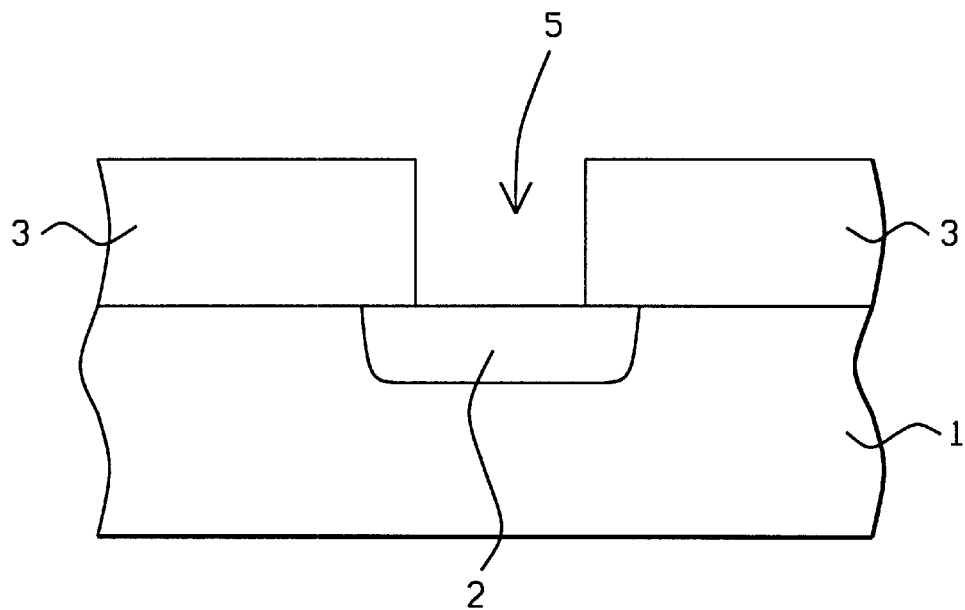

The removal of photoresist shape 4, is next addressed and shown schematically in FIG. 3. Removal of photoresist using plasma oxygen ashing, as was previously used to remove the photoresist shape used top define conductive region 2, can be a critical process step. Exposure of the top surface conductive region 2, to a plasma oxygen ashing procedure results in the growth of a native, silicon oxide layer, on the exposed surface of conductive region 2. The native oxide formed as a result of exposure to plasma oxygen is comprised with a stoichiometric silicon oxide ($SiO_2$), component, as well as with a substoichiometric silicon oxide component ($SiO_x$), where x is greater than zero, but less than two. Subsequent plasma oxygen ashing post-cleans, even in a buffered hydrofluoric acid solution, do not remove the substoichiometric silicon oxide component from the top surface of conductive region 2, thus deleteriously interfering with the formation of a subsequent metal silicide layer, formed on the portion of conductive region 2, exposed in contact hole 5. Therefore a photoresist removal procedure, excluding an oxidizing species which will form the undesirable substoichiometric silicon oxide layer, is used in this invention to remove photoresist shape 4. A chemical mechanical polishing (CMP), procedure is employed to selectively remove photoresist shape 4, from the top surface of insulator layer 3, with the CMP procedure terminating at the appearance of insulator layer 3. The CMP procedure does not result in the formation of a native oxide on the surface of conductive region 2. If desired an optional, post-CMP cleanup, used to remove any photoresist residue still remaining, can be performed using a sulfuric—peroxide ($H_2SO_4$—$H_2O_2$), at a temperature between about 100 to 150° C. The sulfuric-peroxide treatment will result in the growth of an oxide layer on the exposed surface of conductive region 2, however this native oxide is only comprised of stoichiometric silicon oxide, and unlike the substoichiometric silicon oxide counterpart, can be removed via a buffered hydrofluoric acid treatment, performed prior to metal deposition.

Figure 4:
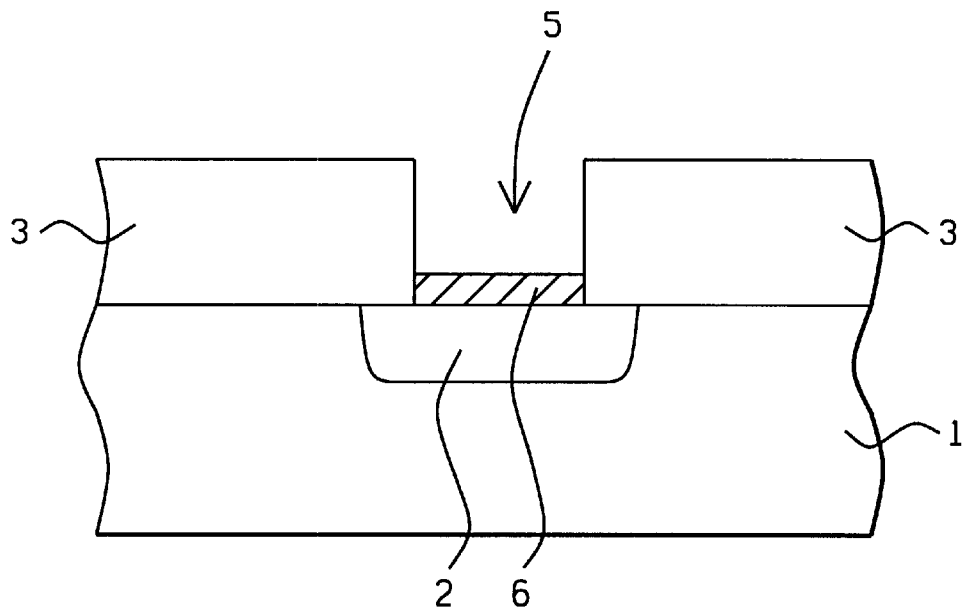

The attainment of metal silicide layer 6, on the exposed portion of the top surface of conductive region 2, is next addressed and schematically shown in FIG. 4. A pre-clean procedure, used prior to metal deposition, is first performed using a buffered hydrofluoric acid solution. The pre-clean procedure will remove the native oxide, comprised of stoichiometric silicon oxide, that is formed if the sulfuric-peroxide option was employed post CMP. Deposition of a metal layer, such as titanium, nickel, cobalt, or tantalum, is next performed via plasma vapor deposition procedures, to a thickness between about 100 to 1000 Angstroms. An anneal procedure is next performed either in a conventional furnace, or in a rapid thermal anneal furnace, at a temperature between about 500 to 800° C., resulting in the formation of metal silicide layer 6, on the portion of surface of conductive region 2, exposed in contact hole 5, while portions of the metal layer, residing on insulator layer 3, remain unreacted. A solution of $H_2SO_4$—$H_2O_2$—$NH_4OH$, is next used at a temperature between about 30 to 90° C. to selectively remove the unreacted metal from insulator layer 3, resulting in metal silicide layer 6, residing only on the surface of conductive region. The ability to prevent the unwanted growth of a substoichiometric silicon oxide layer on the exposed surface of the contact hole, prior to metal deposition, allowed optimum metal silicide formation to be realized. If desired a second anneal procedure can be performed to convert metal silicide layer 6, to a lower resistance metal silicide phase, enhancing device performance.

While this invention has been particularly shown and described with reference to the preferred embodiments thereof, it will be understood by those skilled in the art that various changes in form and details may be made without departing from the spirit or scope of the invention.

What is claimed is:

1. A method of forming a metal silicide layer on a surface of a heavily doped silicon region, in a semiconductor substrate, with said heavily doped silicon region located at the bottom of a contact hole in an insulator layer, and featuring the removal of a contact hole defining photoresist shape using a combination of procedures that avoid the formation of a native oxide layer comprised with a sub-stoichiometric silicon oxide component, formed on the top surface of the exposed conductive region, comprising the steps of:

forming a heavily doped silicon region in said semiconductor substrate;

forming a composite insulator layer, featuring an overlying, silicon nitride layer, on said heavily doped silicon region;

forming a photoresist shape on said composite insulator layer with an opening in said photoresist shape exposing a portion of said composite insulator;

performing an anisotropic dry etching procedure to remove portion of said insulator layer exposed in said opening in said photoresist shape, and creating said contact hole in said insulator layer, exposing a portion of top surface of said heavily doped silicon region;

performing a chemical mechanical polishing procedure to remove said photoresist shape from the top surface of said silicon nitride layer;

performing a post-chemical mechanical polishing wet clean procedure, creating a native oxide layer on surface of said heavily doped silicon region, with said native oxide layer comprised of a stoichiometric silicon oxide layer;

performing a pre-metal deposition procedure to remove said native oxide;

depositing a metal layer;

performing a first anneal procedure to form a first metal silicide layer on said heavily doped silicon region, while portions of said metal layer located on surfaces of said composite insulator layer remain unreacted, selectively removing said portions of unreacted metal layer from the surfaces of said insulator layer; and performing a second anneal procedure to convert said first metal silicide layer, to a lower resistance, second metal silicide layer.

2. The method of claim 1, wherein said heavily doped silicon region in said semiconductor substrate, is an N type, or P type, source/drain region, with a surface concentration between about 1E19 to 1E21 atoms/$cm^3$.

3. The method of claim 1 wherein said composite insulator layer is comprised of an overlying silicon nitride layer, and an underlying silicon oxide or boro-phosphosilicate glass layer, at a thickness between about 5000 to 12000 Angstroms.

4. The method of claim 1, wherein said opening, in said photoresist shape has a diameter between about 0.05 to 1.0 um.

5. The method of claim 1, wherein said contact hole opening, in said composite insulator layer, is formed via an anisotropic RIE procedure using $CF_4$ or $CF_3$ as an etchant for silicon nitride, and for either silicon oxide or boro-phosphosilicate glass.

6. The method of claim 1, wherein said CMP procedure, used to remove said photoresist shape, is terminated at the appearance of the top surface of said silicon nitride layer.

7. The method of claim 1, wherein said post-chemical mechanical polishing wet clean procedure is performed in a solution of $H_2SO_4$—$H_2O_2$, at a temperature between about 100 to 150° C., forming said native oxide layer on said conductive region, with said native oxide layer comprised of only stoichiometric, $SiO_2$.

8. The method of claim 1, wherein said pre-metal clean, used to remove said native oxide from the surface of said heavily doped silicon region, is performed using a buffered hydrofluoric acid solution.

9. The method of claim 1, wherein the metal layer is chosen from a group that includes titanium, nickel, cobalt, or tantalum, obtained via plasma vapor deposition procedures, at a thickness between about 100 to 1000 Angstroms.

10. The method of claim 1, wherein said first metal silicide layer is formed via a first anneal procedure, performed in a conventional furnace, or in a rapid thermal anneal furnace, at a temperature between about 500 to 800° C.

* * * * *